United States Patent
Jung et al.

(10) Patent No.: US 9,552,872 B2
(45) Date of Patent: Jan. 24, 2017

(54) MEMORY DEVICE

(71) Applicant: Industry-Academic Cooperation Foundation, Yonsei University, Seoul (KR)

(72) Inventors: Seongook Jung, Seoul (KR); Kyoman Kang, Gunpo-si (KR); Hanwool Jeong, Seoul (KR); Young Hwi Yang, Seoul (KR); Juhyun Park, Incheon (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/942,263

(22) Filed: Nov. 16, 2015

(65) Prior Publication Data

US 2016/0141023 A1    May 19, 2016

(30) Foreign Application Priority Data

Nov. 17, 2014   (KR) .................. 10-2014-0159773

(51) Int. Cl.
  *G11C 7/00*    (2006.01)
  *G11C 11/419*  (2006.01)
  *G11C 7/18*    (2006.01)

(52) U.S. Cl.
  CPC .............. *G11C 11/419* (2013.01); *G11C 7/18* (2013.01)

(58) Field of Classification Search
  CPC ..... G11C 11/412; G11C 11/413; G11C 11/419
  USPC .................................. 365/205, 206, 207, 208
  See application file for complete search history.

(56) References Cited

U.S. PATENT DOCUMENTS

| 5,675,529 A | 10/1997 | Poole | |
| 7,663,942 B2* | 2/2010 | Kushida | G11C 7/18 |
| | | | 365/154 |
| 2011/0007580 A1* | 1/2011 | Houston | G11C 7/18 |
| | | | 365/189.15 |

FOREIGN PATENT DOCUMENTS

| KR | 10-0483028 B1 | 4/2005 |
| KR | 10-0812520 B1 | 3/2008 |

OTHER PUBLICATIONS

H. Fuketa, M. Hashimoto, Y. Mitsuyama, and T. Onoye, "Alpha-particle-induced soft errors and multiple cell upsets in 65-nm 10T sub-threshold SRAM," in *Proc. IEEE Int. Reliability Physics Symp.*, May 2-6, 2010, pp. 213-217.

(Continued)

*Primary Examiner* — Son Dinh
(74) *Attorney, Agent, or Firm* — Harness, Dickey & Pierce, P.L.C.

(57) ABSTRACT

Disclosed is a memory device. The memory device includes a bit-cell comprising a cross-coupled inverter and pass gate transistor connected to data storage node of the cross-coupled inverter, a read buffer transistor having a drain terminal connected to a bit line for read operation and a gate terminal connected to the pass gate transistor, a write operation transistor connected between the pass gate transistor and a bit line for write operation, and a drive transistor unit which is connected to a local line between the pass gate transistors and the write operation transistor and which provide a voltage to a gate terminal of the read buffer transistor based on a data value stored at the bit-cell.

17 Claims, 10 Drawing Sheets

(56) References Cited

OTHER PUBLICATIONS

Y.-N. Chen, C.-Y. Hsieh, M.-L. Fan, V. P.-H. Hu, P. Su, and C. T. Chuang, "Impacts of intrinsic device variations on the stability of FinFET subthreshold SRAMs," in *Proc. ICICDT*, 2011, pp. 1-4.

A. Agarwal, B. C. Paul, S. Mukhopadhyay, and K. Roy, "Process variation in embedded memories: Failure analysis and variation aware architecture," *IEEE J. Solid-State Circuits*, vol. 40, No. 9, pp. 1804-1814, Sep. 2005.

M. J. M. Pelgrom, A. C. J. Duinmaijer, and A. P. G.Welbers, "Matching properties of MOS transistors," *IEEE J. Solid-State Circuits*, vol. 24, No. 5, pp. 1433-1440, Oct. 1989.

B. H. Calhoun, J. F. Ryan, S. Khanna, M. Putic, and J. Lach, "Flexible circuits and architectures for ultralow power," *Proc. IEEE*, vol. 98, No. 2, pp. 267-282, Feb. 2010.

L. Chang, R. K. Montoye, Y. Nakamura, K. A. Batson, R. J. Eickemeyer, R. H. Dennard, W. Haensch, and D. Jamsek, "An 8T-SRAM for variability tolerance and low-voltage operation in high performance caches," *IEEE J. Solid-State Circuits*, vol. 43, No. 4, pp. 956-963, Apr. 2008.

N. Verma and A. Chandrakasan, "A 256 kb 65 nm 8T subthreshold SRAM employing sense-amplifier redundancy," *IEEE J. Solid-State Circuits*, vol. 43, No. 1, pp. 141-149, Jan. 2008.

T.-H.Kim, J. Liu, J. Keane, andC. Kim, "A 0.2V, 480 kb subthreshold SRAM with 1 k cells per bitline for ultra-low-voltage computing," *IEEE J. Solid-State Circuits*, vol. 43, No. 2, pp. 518-529, Feb. 2008.

B. H. Calhoun and A. P. Chandrakasan, "A 256-kb 65-nm subthreshold SRAM design for ultra-low-voltage operation," *IEEE J. Solid-State Circuits*, vol. 42, No. 3, pp. 680-688, Mar. 2007.

I. J. Chang, J.-J. Kim, S. P. Park, and K. Roy, "A 32 kb 10T sub-threshold SRAM array with bit-interleaving and differential read scheme in 90 nm CMOS," *IEEE J. Solid-State Circuits*, vol. 44, No. 2, pp. 650-658, Feb. 2009.

M. Khayatzadeh, Y. Lian, "Average-8T Differential-Sensing Subthreshold SRAM With Bit Interleaving and 1k Bits Per Bitline," *IEEE Trans. Very Large Scale Integr. (VLSI) Syst.*, vol. 22, No. 5, pp. 971-982, May 2014.

C. Auth, C. Allen, A. Blattner, D. Bergstrom, M. Brazier, M. Bost, et al., "A 22nm high performance and low-power CMOS technology featuring fully-depleted tri-gate transistors, self-aligned contact and high density MIM capacitors," in *Proc. VLSI Symp. Technol.*, 2012, pp. 131-132.

D. Ingerly et al., "Low-k interconncet stack with metal-insulator-metal capacitors for 22nm high volume manufacturing," *IEEE International Interconnect Technology Conference Proceedings*, pp. 12.2.1-3, 2012.

H. Kawasaki, V. S. Basker, T. Yamashita, C.-H. Lin, Y. Zhu, et al, "Challenges and solutions of FinFET integration in an SRAM cell and a logic circuit for 22-nm node and beyond," *IEDM Tech. Dig.*, pp. 289-292, Dec. 2009.

Tony T.Kim and Ngoc Le Ba, "A low Voltage 8-T SRAM with PVT-Tracking Bitline Sensing Margin Enhancement for High Operating Temperature", 2013 IEEE Asian Solid-State Circuits Conference 14-1.

Chao-Kuei Chung et al., "A 40nm 256kb 6T SRAM with threshold power-gating, low-swing global read bit-line, and charge-sharing write with Vtrip-tracking and negative source-line write-assists", 2014 IEEE SOCC, pp. 455-462, Sep. 2-5, 2014.

* cited by examiner

MEMORY DEVICE

CROSS-REFERENCE TO RELATED APPLICATIONS

A claim for priority under 35 U.S.C. §119 is made to Korean Patent Application No. 10-2014-0159773 filed Nov. 17, 2014, in the Korean Intellectual Property Office, the entire contents of which are hereby incorporated by reference.

BACKGROUND

The inventive concepts described herein relate to a memory device.

FIG. 1 is a circuit diagram illustrating a conventional static random access memory bit-cell. As illustrated in FIG. 1, a conventional SRAM bit-cell includes eight transistors including a cross-coupled inverter pair (IN1, IN2) and stores logic 0 and logic 1 at two data storage nodes, respectively. During a write operation, pass gate transistors PG1 and PG2 connect bit lines BL and BLB with the data storage nodes, respectively. A signal is shared by bit-cells arranged along the row direction and is transmitted to the bit-cells through a word line WL and makes it possible to turn on or off the pass gate transistors. A signal is shared by bit-cells arranged along the column direction and is transmitted to the bit-cells through the bit lines BL and BLB.

During a read operation, a ground voltage (i.e., 0 V) is applied to the word line WL, and a supply voltage is applied to the bit lines BL and BLB and a word line for read operation RWL. According to this bias condition, a bit line for read operation RBL is changed from the supply voltage to a floating state, and information stored at a bit-cell is read by detecting a current which flows through read buffer transistors N1 and N2. A current flowing through the read buffer transistors N1 and N2 during the read operation is prevented from flowing into a data storage node, and data stored at a bit-cell is prevented from flipping due to a current flowing during the read operation. Accordingly, read stability is improved. However, in the case of a conventional SRAM, data flip occurs in a row half-selected bit-cell during a write operation due to a half-select issue.

FIG. 2 is a circuit diagram for describing a problem which occurs in a row half-selected bit-cell during a write operation of a conventional SRAM. In FIG. 2, during a write operation, a first bit-cell placed at the left is a bit-cell in which a write operation is performed, and a second bit-cell placed at the right is a bit-cell in which a write operation is not performed. The case mostly occurs in a SRAM having a bit-interleaving structure. The bit-interleaving structure refers to a structure arranged such that bit-cells belonging to different words are arranged to be adjacent to each other. That is, in the bit-interleaving structure, bit-cells belonging to the same words are not arranged to be adjacent to each other. The bit-interleaving structure makes it possible to prevent data of some bit-cells in the same word from being simultaneously lost due to a soft error. Moreover, even though the soft error occurs, the bit-interleaving structure makes it possible to minimize the loss of data in the same word. Accordingly, it is possible to recover data easily.

Referring to FIG. 2, the first bit-cell and the second bit-cell belong to different words from each other. When a write operation about a word to which the first bit-cell placed at the left belongs is performed, a supply voltage $V_{DD}$ is also applied to the word line WL of the second bit-cell placed at the right. Accordingly, current flows into a data storage node, in which logic 0 is stored, through the pass gate transistor PG1 and a pull-down transistor PD1 of a cross-coupled inverter at the second bit-cell placed at the right. Accordingly, a read disturbance such as the data flip occurs at the second bit-cell (i.e., a row half-selected bit-cell).

To solve the read disturbance occurring at a row half-selected bit-cell during a write operation, after data in all of row half-selected bit-cells is read before the write operation is performed, an operation to write information thus read at a row half-selected bit-cell is again performed. This is referred to as "write-back operation". However, because a read operation and a write operation are performed with respect to all row half-selected bit-cells in a write-back operation whenever a write operation is performed, power consumption is very much.

FIG. 3 is a circuit diagram illustrating another example of a conventional SRAM structure. In a SRAM of FIG. 3, the pass gate transistors PGL1 and PGR1 placed at the right are turned off during a write operation of the first bit-cell placed at the left, thereby preventing a read disturbance at a row half-selected bit-cell without a write-back operation. That is, in the SRAM of FIG. 3, a supply voltage is applied to both a word line WLR in the row direction and a word line WLC in the column direction, and thus a write operation is performed only at one selected bit-cell. However, the SRAM of the above-described structure necessitates ten transistors per bit-cell, thereby causing an increase in an area per bit-cell and making it difficult to miniaturize a memory.

SUMMARY

Embodiments of the inventive concept provide a memory device with superior read stability and read speed.

Other embodiments of the inventive concept provide a memory device in which bit-interleaving is available without a write-back operation.

Other embodiments of the inventive concept provide a memory device having a small area and an excellent operating characteristic at a low supply voltage.

Other embodiments of the inventive concept provide a memory device which makes it possible to reduce unnecessary dynamic power consumption at a column or row half-selected bit-cell.

According to an embodiment of the inventive concept, a memory device may include a bit-cell including a cross-coupled inverter and pass gate transistors connected to data storage nodes of the cross-coupled inverter, a read buffer transistor having a drain terminal connected to a bit line for read operation and a gate terminal connected to the pass gate transistors, a write operation transistor connected between the pass gate transistors and a bit line for write operation, and a drive transistor unit connected to a local line between the pass gate transistors and the write operation transistor and providing a voltage to a gate terminal of the read buffer transistor based on a data value stored at the bit-cell.

The drive transistor unit may include a first drive transistor having a drain terminal connected to a first local line between a first pass gate transistor and a first write operation transistor, which is placed near a first data storage node of the two data storage nodes, and a gate terminal connected to a second local line between a second pass gate transistor and a second write operation transistor, which is placed near a second data storage node thereof, a second drive transistor having a gate terminal connected to the first local line and a drain terminal connected to the second local line and a supply voltage application unit configured to apply a driving voltage corresponding to a supply voltage to source terminals of the first drive transistor and the second drive transistor.

The drive transistor unit may drive the voltage to a gate terminal of the read buffer transistor by applying a voltage corresponding to the driving voltage to a local line, corresponding to a data storage node storing logic 1, during a read operation.

The supply voltage application unit may include a third drive transistor having a drain terminal connected to source terminals of the first drive transistor and the second drive transistor and a source terminal to which a supply voltage is applied.

Voltage of a word line for read operation may be applied to a gate terminal of the third drive transistor and a source terminal of the read buffer transistor.

The memory device may further include a block mask transistor connected between the local line and the bit line for write operation and connecting the bit line for write operation with the local line during a hold operation.

During a read operation, after voltage of a gate terminal of the block mask transistor is reduced, the voltage of the word line of a bit-cell where the read operation is performed increases, and a voltage of the word line for read operation decreases.

During a read operation, a suppression voltage lower than a supply voltage may be applied to a word line corresponding to a bit-cell in which the read operation is performed.

According to another embodiment of the inventive concept, a memory device may include a plurality of bit-cells each including a cross-coupled inverter, a first pass gate transistor connected to a first data storage node of the cross-coupled inverter, and a second pass gate transistor connected to a second data storage node of the cross-coupled inverter. First pass gate transistors of the bit-cells belonging to the same group may be connected to a first local line, and second pass gate transistors of the bit-cells may be connected to a second local line. The memory device may further include a first write operation transistor connected between the first local line and the first bit line for write operation, a second write operation transistor connected between the second local line and the second bit line for write operation, a first read buffer transistor having a drain terminal connected to the first bit line for read operation and a gate terminal connected to the first local line, a second read buffer transistor having a drain terminal connected to the second bit line for read operation and a gate terminal connected to the second local line, and a drive transistor unit including a first drive transistor having a drain terminal connected to the first local line and a gate terminal connected to the second local line, and a second drive transistor having a drain terminal connected to the second local line and a gate terminal connected to first second local line.

The memory device may further include a first block mask transistor connected between the first local line and the first bit line for write operation and connecting the first bit line for write operation with the first local line during a hold operation and a second block mask transistor connected between the second local line and the second bit line for write operation and connecting the second bit line for write operation with the second local line during the hold operation.

During a read operation, a suppression voltage lower than a supply voltage may be applied to a word line corresponding to a bit-cell in which the read operation is performed.

A negative voltage lower than a ground voltage may be applied to one of the first bit line for write operation and the second bit line for write operation during a write operation. A suppression voltage lower than a supply voltage may be applied to a word line corresponding to a bit-cell in which a write operation is performed.

According to an embodiment of the inventive concept, a memory device may include a plurality of bit-cells each including a cross-coupled inverter, a first pass gate transistor connected to a first data storage node of the cross-coupled inverter, and a second pass gate transistor connected to a second data storage node of the cross-coupled inverter. First pass gate transistors of the bit-cells belonging to the same group may be connected to a first local line, and second pass gate transistors of the bit-cells may be connected to a second local line. The memory device may further include a drive transistor unit connected between the first local line and the second local line and applying a voltage corresponding to the driving voltage to a local line corresponding to a data storage node storing logic 1 during a read operation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
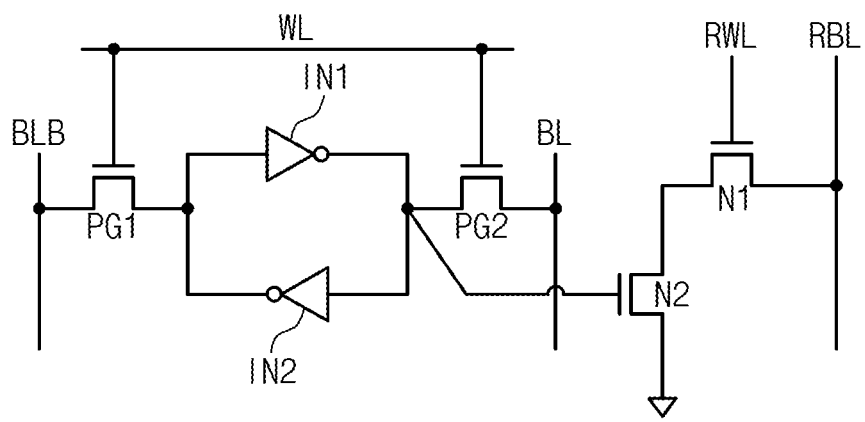
FIG. 1 is a circuit diagram illustrating a conventional static random access memory bit-cell.
Figure 2:
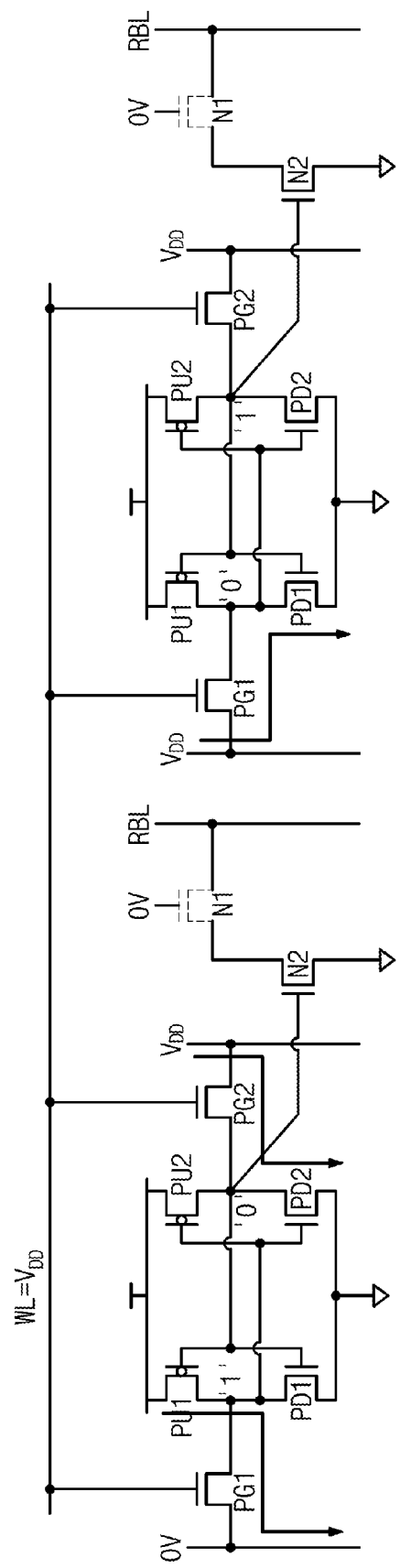
FIG. 2 is a circuit diagram for describing a problem which occurs in a row half-selected bit-cell during a write operation of a conventional SRAM.
Figure 3:
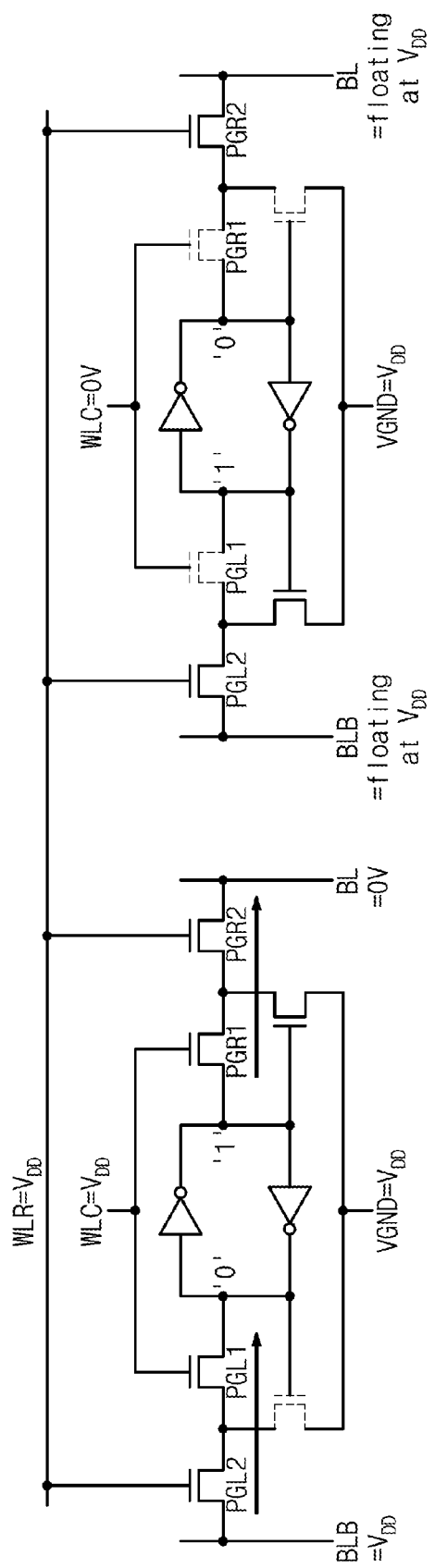
FIG. 3 is a circuit diagram illustrating conventional other SRAM structures.

According to an embodiment of the inventive concept, other advantages and features and methods of accomplishing the same may be understood more readily with reference to the following detailed description of an embodiment and the accompanying drawings. However, the inventive concept is not limited to the embodiments set forth herein; the inventive concept will only be defined by the appended claims.

Even though it is not defined, all terms (including technical or scientific terms) used herein, all terms have the same meaning as being generally accepted by the general technology in the art belonging to inventive concept. General descriptions about the well-known configurations may be omitted so as not to obscure the subject matter of the inventive concept. A configuration which is equal to or corresponds to drawings in the inventive concept is possible using the same reference numerals.

The terminology used herein to describe embodiments of the invention is not intended to limit the scope of the invention. The articles "a," "an," and "the" are singular in that they have a single referent, however the use of the singular form in the present document should not preclude the presence of more than one referent. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof. Sense of being "connected to other components, which components are herein or an element is directly connected to the other component, is meant to include the other components that are indirectly connected to the medium.

Figure 4:
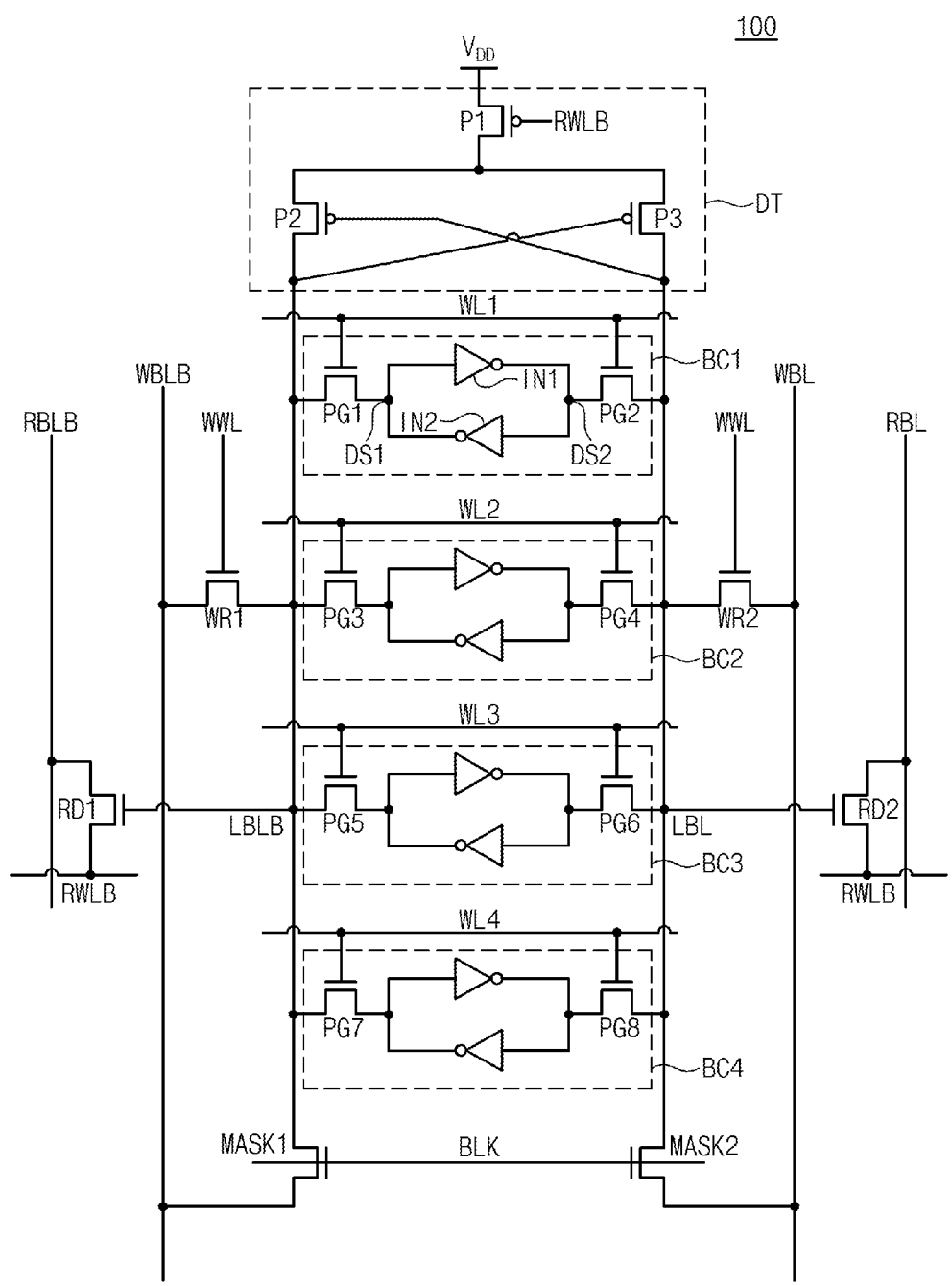
FIG. 4 is a circuit diagram illustrating a memory device according to an embodiment of the inventive concept.

FIG. 4 is a circuit diagram illustrating a memory device 100 according to an embodiment of the inventive concept. Referring to FIG. 4, a memory device 100 according to an embodiment of the inventive concept may include bit-cells BC1 to BC4, write operation transistors WR1 and WR2, read buffer transistors RD1 and RD2, block mask transistors MASK1 and MASK2, and a drive transistor unit DT. The bit-cells BC1 to BC4 may have the same structure. A bit-cell structure will be described on a basis of the first bit-cell BC1. The first bit-cell BC1 may include cross-coupled inverters IN1 and IN2, pass gate transistors PG1 and PG2, and a word line WL1 and may further have two data storage nodes DS1 and DS2 between the cross-coupled inverters IN1 and IN2 and the pass gate transistors PG1 and PG2.

The first pass gate transistor PG1 may be connected to the first data storage node DS1 of the cross-coupled inverters IN1 and IN2, and the second pass gate transistor PG2 may be connected to the second data storage node DS2 of the cross-coupled inverters IN1 and IN2. The first pass gate transistors PG1, PG3, PG5, and PG7 of the bit-cells BC1 to BC4 which belong to the same group may be connected to a first local line LBLB, and the second pass gate transistors PG2, PG4, PG6, and PG8 of the bit-cells BC1 to BC4 which belong to the same group may be connected to a second local line LBL. In FIG. 4, an embodiment of the inventive concept is exemplified as the four bit-cells BC1 to BC4 belong to the same group. However, the scope and spirit of the inventive concept may not be limited thereto. For example, bit-cells of which the number is smaller than or equal to 3 or smaller than or equal to 5 may belong to the same group.

The word line WL1 may be connected to gate terminals of the first pass gate transistor PG1 and the second pass gate transistor PG2. During a hold operation, a ground voltage may be applied to word lines WL1 to WL4, and thus the pass gate transistors PG1 to PG8 may be turned off. The first pass gate transistor PG1 and the second pass gate transistor PG2 may be turned on by applying a supply voltage to gate terminals of the first pass gate transistor PG1 and the second pass gate transistor PG2 at the first bit-cell BC1, in which a read operation and a write operation are performed, through the word line WL1.

A drain terminal and a source terminal of the first write operation transistor WR1 may be respectively connected to the first local line LBLB and the first bit line for write operation WBLB, and the first write operation transistor WR1 may be connected to the first pass gate transistors PG1, PG3, PG5, and PG7 and the first bit line for write operation WBLB. A drain terminal and a source terminal of the second write operation transistor WR2 may be respectively connected to the second local line LBL and the second bit line for write operation WBL, and the second write operation transistor WR2 may be connected to the second pass gate transistors PG2, PG4, PG6, and PG8 and the second bit line for write operation WBL.

A word line for write operation WWL may be connected to a gate terminal of the first write operation transistor WR1. The write operation transistor WR1 may be turned off by applying a ground voltage to the word line for write operation WWL during a hold operation or a read operation. The first write operation transistor WR1 may be turned on by applying a supply voltage to a gate terminal of the first write operation transistor WR1 through the word line for write operation WWL during a write operation. A ground voltage may be applied to a drain terminal of the first write operation transistors WR1 and a source terminal of the second write operation transistors WR2 through the first bit line for write operation WBLB and the second bit line for write operation WBL during a hold operation or a read operation. Data (e.g., logic 0 or logic 1) which is to be stored at a bit-cell during a write operation may be applied to the first write operation transistor WR1 and the second write operation transistor WR2 through the first bit line for write operation WBLB and the second bit line for write operation WBL.

A drain terminal of the first read buffer transistor RD1 may be connected to the first bit line for read operation RBLB, and a gate terminal of the first read buffer transistor RD1 may be connected to the first local line LBLB (i.e., the first pass gate transistors PG1, PG3, PG5, and PG7). A drain terminal of the second read buffer transistor RD2 may be connected to the second bit line for read operation RBL, and a gate terminal of the second read buffer transistor RD2 may be connected to the second local line LBL (i.e., the second pass gate transistors PG2, PG4, PG6, and PG8). A supply voltage may be always provided to the first bit line for read operation RBLB, compared with a read operation.

The word line for read operation RWLB may be connected to source terminals of the first read buffer transistor RD1 and the second read buffer transistor RD2. A supply voltage may be applied to source terminals of the first read buffer transistor RD1 and the second read buffer transistor RD2 through the word line for read operation RWLB during a hold operation or a write operation, and a ground voltage may be applied to the source terminals during a read operation. A supply voltage may be applied to the word line for read operation RWLB during a hold operation or a write operation, and a ground voltage may be applied to the word line for read operation RWLB during a read operation.

A drain terminal of the first block mask transistor MASK1 may be connected to the first local line LBLB. A source terminal of the first block mask transistor MASK1 may be connected to the first bit line for write operation WBLB. That is, the first block mask transistor MASK1 may be connected between the first local line LBLB and the first bit line for write operation WBLB. The first block mask transistor MASK1 may connect the first bit line for write operation WBLB with the first local line LBLB during a hold operation. A drain terminal of the second block mask transistor MASK2 may be connected to the second local line LBL. A source terminal of the second block mask transistor MASK2 may be connected to the second bit line for write operation WBL. That is, the second block mask transistor MASK2 may be connected between the second local line LBL and the second bit line for write operation WBL. The second block mask transistor MASK2 may connect the second bit line for write operation WBL with the second local line LBL during a hold operation.

A block mask voltage may be applied to gate terminals of the first block mask transistor MASK1 and the second block mask transistor MASK2 through a block mask line BLK. A supply voltage may be applied to the gate terminals of the first block mask transistor MASK1 and The second block mask transistor MASK2 during a hold operation, and a ground voltage may be applied to the gate terminals of the first block mask transistor MASK1 and The second block mask transistor MASK2 during a read operation or a write operation.

A signal (i.e., row based signal) shared by bit-cells arranged in the row direction may be transmitted to a bit-cell through the word lines WL1 to WL4, the block mask line BLK, and the word line for read operation RWLB, and a signal (i.e., column based signal) shared by bit-cells arranged in the column direction may be transmitted to a bit-cell through bit lines for read operation RBL and RBLB, bit lines for write operation WBLB and WBL, and a word line for write operation WWL.

The drive transistor unit DT may be connected between the first local line LBLB and the second local line LB. The drive transistor unit DT may drive the gate terminals of the first read buffer transistor RD1 and the second read buffer transistor RD2 with a driving voltage (i.e., $V_{DD}$) by providing a voltage corresponding to a driving voltage to a local line, corresponding to a data storage node storing logic 1, based on a data value stored at a bit-cell during a read operation.

The drive transistor unit DT may include a first drive transistor P2, a second drive transistor P3, and a third drive transistor P1. A drain terminal of the first drive transistor P2 may be connected to the first local line LBLB, and a gate terminal of the first drive transistor P2 may be connected to the second local line LBL. A drain terminal of the second drive transistor P3 may be connected to the second local line LBL, and a gate terminal of the second drive transistor P3 may be connected to the first local line LBLB.

A drain terminal of the third drive transistor P1 may be connected to the source terminals of the first and second drive transistors P2 and P3 and may receive the supply voltage (i.e., $V_{DD}$) through a source terminal of the third drive transistor P1. The third drive transistor P1 may correspond to a supply voltage application unit for providing a driving voltage corresponding to the supply voltage to source terminals of the first drive transistor P2 and the second drive transistor P3 during a read operation. As in the source terminals of the read buffer transistors RD1 and RD2, the word line for read operation RWLB may be connected to the gate terminal of the third drive transistor P1.

In FIG. 4, an embodiment of the inventive concept is exemplified as each of the pass gate transistors PG1 to PG8, the read operation transistors WR1 and WR2, the block mask transistors MASK1 and MASK2, and the read buffer transistor RD1 and RD2 is implemented with an N-type transistor and each of the drive transistors P1 to P3 is implemented with a P-type transistor. However, the scope and spirit of the inventive concept may not be limited thereto. For example, the above-mentioned transistors may be implemented with other types of transistors.

Figure 5:
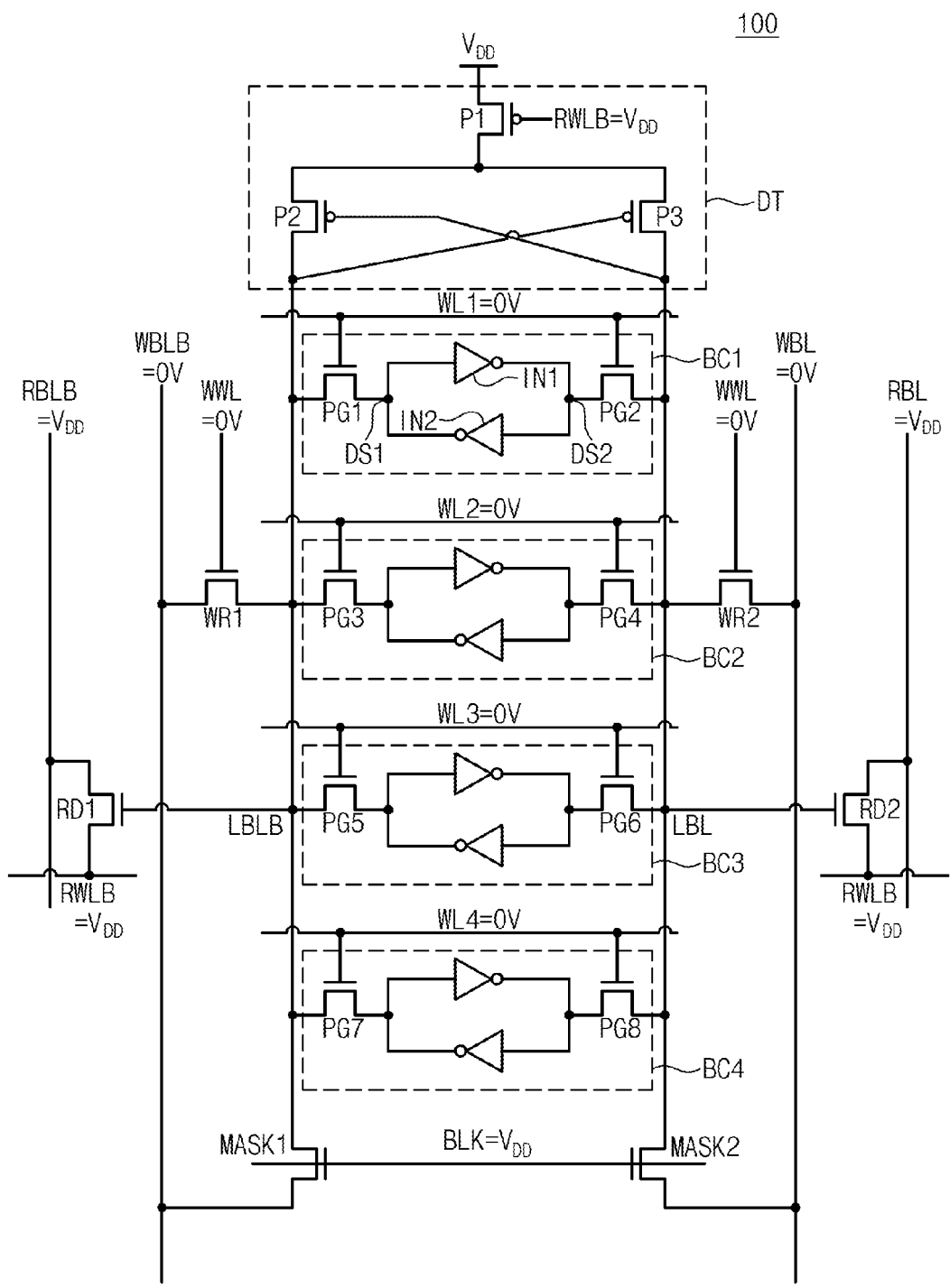
FIG. 5 is a circuit diagram illustrating a hold operation of a memory device according to an embodiment of the inventive concept.

FIG. 5 is a circuit diagram illustrating a hold operation of a memory device 100 according to an embodiment of the inventive concept. Referring to FIGS. 4 and 5, a ground voltage (i.e., 0 V) may be applied to word lines WL1 to WL4 to isolate data storage nodes DS1 and DS2. Accordingly, data stored at bit-cells BC1 to BC4 may not be changed during a hold operation.

During a hold operation, a supply voltage (i.e., $V_{DD}$) may be applied to source terminals of the read buffer transistors RD1 and RD2 through the word line for read operation RWLB to prevent a power (or current) leakage of the bit lines for read operation RBLB and RBL. Compared with a read operation, the supply voltage may be applied to drain terminals of the read buffer transistors RD1 and RD2, but the supply voltage may be applied to a source terminal of the read buffer transistors RD1 and RD2. Accordingly, a current may not flow into the read buffer transistors RD1 and RD2.

During a hold operation, the ground voltage (i.e., 0 V) may be applied to the bit lines for write operation WBL and WBLB and the word line for write operation WWL, and the supply voltage (i.e., $V_{DD}$) may be applied to gate terminals of the block mask transistors MASK1 and MASK2. Accordingly, because the first local line LBLB may be connected to the first bit line for write operation WBLB having a ground voltage, the second local line LBL may be connected to the second bit line for write operation WBL having a ground voltage, and a ground voltage may be applied to gate terminals of the read buffer transistors RD1 and RD2 through the first local line LBLB and the second local line LBL, the read buffer transistors RD1 and RD2 may be turned off.

Figure 6:
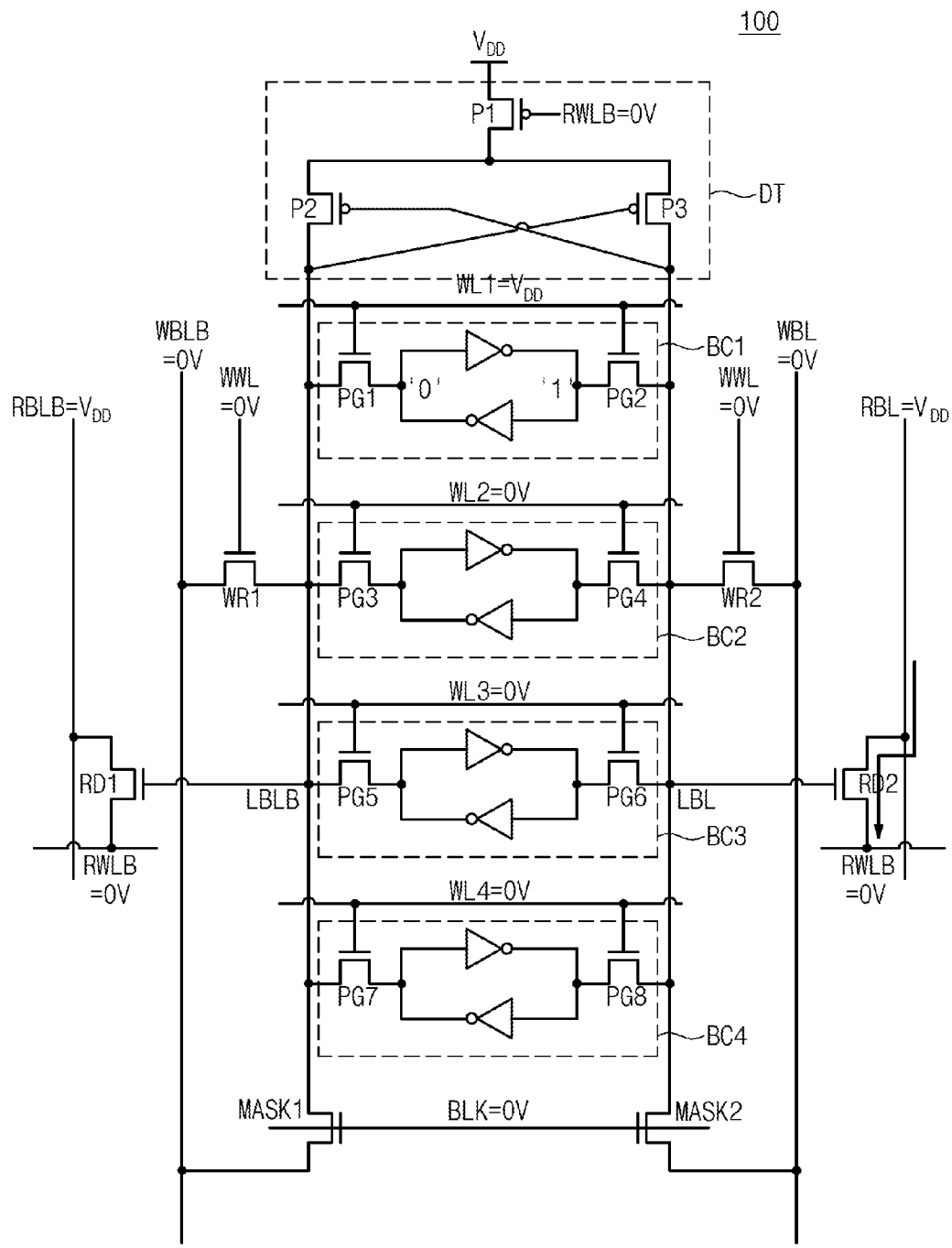
FIG. 6 is a circuit diagram illustrating a read operation of a memory device according to an embodiment of the inventive concept.

FIG. 6 is a circuit diagram illustrating a read operation of a memory device 100 according to an embodiment of the inventive concept. Referring to FIGS. 4 and 6, as in a hold operation, a ground voltage (i.e., 0V) may be applied to the bit lines for write operation WBL and WBLB. The write operation transistors WR1 and WR2 may be turned off. A supply voltage (i.e., $V_{DD}$) may be applied to the bit lines for read operation RBLB and RBL. The pass gate transistors PG1 and PG2 may be turned on by applying the supply voltage (i.e., $V_{DD}$) to gate terminals of the pass gate transistors PG1 and PG2 at the bit-cell BC1 in which a read operation is performed.

During a read operation, the ground voltage (i.e., 0 V) may be applied to gate terminals of the block mask transistors MASK1 and MASK2 instead of a supply voltage. Accordingly, the local lines LBLB and LBL may be floated. Based on data of the bit-cell BC1 selected as a result of determining that a read operation is performed, one of the two local lines LBLB and LBC may be changed into 0 V and the other thereof may be changed into a value (i.e., $V_{DD}-V_{th}$). When a voltage of the word line for read operation RWLB changed from the supply voltage (i.e., $V_{DD}$) to the ground voltage (i.e., 0 V), the voltage may be applied to source terminals of the read buffer transistors RD1 and RD2 so as to read precise data through a current value flowing into the read buffer transistors RD1 and RD2.

In an embodiment of FIG. 6, a voltage value corresponding to logic 1 stored at the second data storage node DS2 may be transmitted to a gate terminal of the second read buffer transistor RD2, and thus the second read buffer transistor RD2 may be turned on. In this case, the second bit line for read operation RBL may be discharged, thereby making it possible to read data stored at the bit-cell BC1. At this time, the drive transistor unit DT may drive only a gate terminal of the second read buffer transistor RD2 based on data stored at a bit-cell, to allow a voltage difference between the first local line LBLB and the second local line LBL to approximate to a voltage difference between the supply voltage and the ground voltage.

That is, as the ground voltage (i.e., 0 V) may be applied to a gate terminal of the third drive transistor P1 through the word line for read operation RWLB, the third drive transistor P1 may be turned on. In this case, the supply voltage may be applied to drain terminals of the first drive transistor P2 and the second drive transistor P3. When logic 0 is stored at the first data storage node DS1, the ground voltage may be applied to the first local line LBLB. Accordingly, the ground voltage may be applied to a gate terminal of the second drive transistor P3, thereby turning on the second drive transistor P3. As a result, the supply voltage (i.e., $V_{DD}$) may be applied to a source terminal of the second drive transistor P3, and a gate terminal of the second read buffer transistor RD2 may be driven with a high voltage. In this case, data stored at a bit-cell may be read by rapidly and stably turning on the second read buffer transistor RD2.

On the other hand, when logic 0 is stored at the second data storage node DS2, the supply voltage (i.e., $V_{DD}$) may be applied to a source terminal of the first drive transistor P2, and a gate terminal of the first read buffer transistor RD1 may be driven with a high voltage. Accordingly, data stored at a bit-cell may be read by rapidly and stably turning on the first read buffer transistor RD1.

Figure 7:
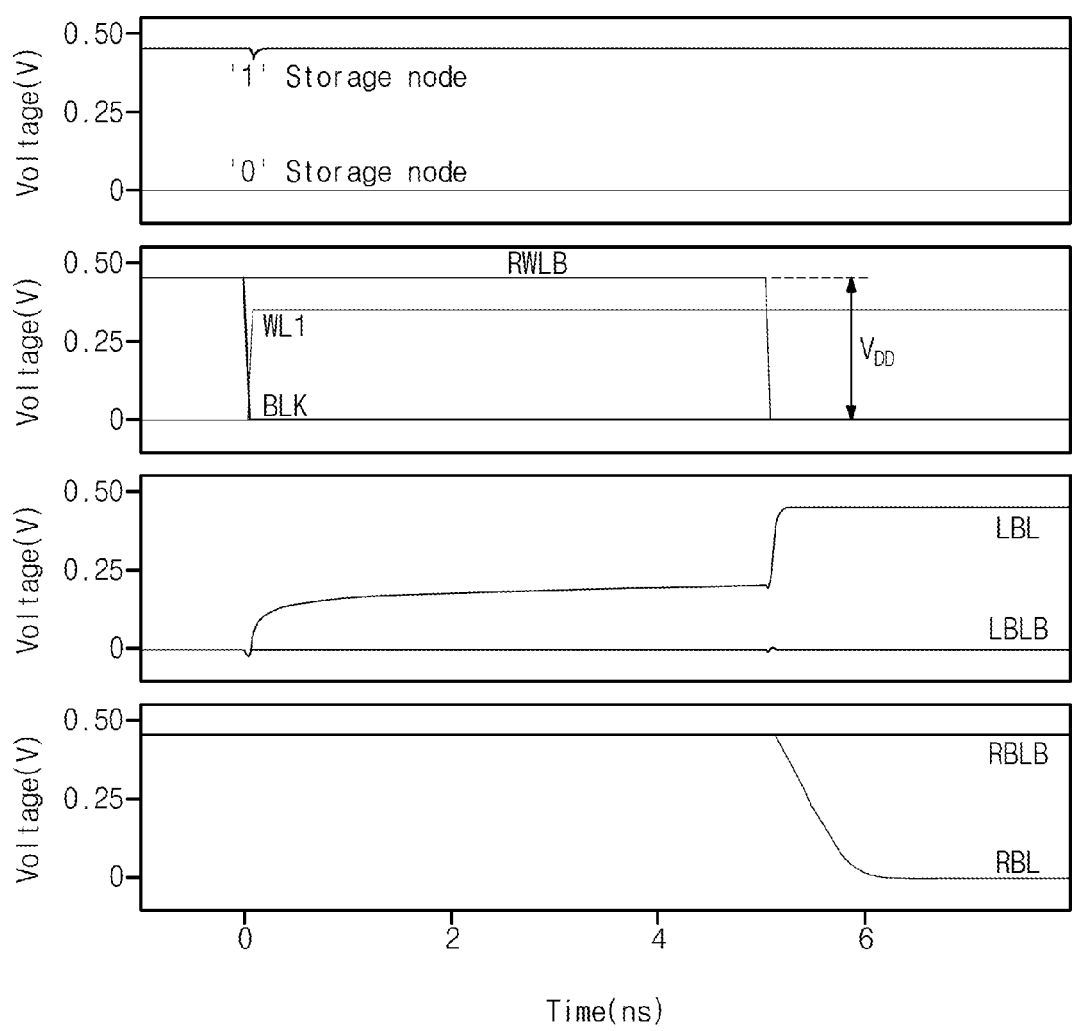
FIG. 7 is graphs illustrating a change of a voltage applied to a word line, a word line for read operation, a block mask line, local lines, and bit lines for read operation during a read operation of a memory device according to an embodiment of the inventive concept.

FIG. 7 is graphs illustrating a change of a voltage applied to a word line WL1, a word line for read operation RWLB, a block mask line BLK, local lines LBL and LBLB, and bit lines for read operation RBLB and RBL during a read operation of a memory device 100 according to an embodiment of the inventive concept. A supply voltage (i.e., $V_{DD}$) is set to 0.45 V when the memory device 100 is simulated.

Referring to FIGS. 6 and 7, the bit lines for write operation WBLB and WBL may be fixed with a ground voltage (i.e., 0 V) during a read operation. At this time, when the pass gate transistors PG1 and PG2 of a bit-cell are turned on before the block mask transistors MASK1 and MASK2 may be turned off by applying a ground voltage to gate terminals of the block mask transistors MASK1 and MASK2, the bit lines for write operation WBLB and WBL may be momentarily connected to a data storage node. Accordingly, data stored at a bit-cell may be lost. Moreover, when the ground voltage (i.e., 0 V) is applied to the word line for read operation RWLB with a voltage difference between the local lines LBLB and LBL not sufficiently developed after the supply voltage (i.e., VDD) is applied to the word line WL1, the voltage difference between the local lines LBLB and LBL may be not developed.

As illustrated in FIG. 7, during a read operation, there may be a need to control a timing in the following order: lowering a voltage (i.e., BLK) of a gate terminal of the block mask transistors MASK1 and MASK2, increasing a voltage of the word line WL1, sufficiently developing a voltage difference between the local lines LBLB and LBL after the supply voltage (i.e., VDD) is applied to the word line WL1, and lowering a voltage of the word line for read operation RWLB to the ground voltage.

When the ground voltage (i.e., 0 V) is applied to the word line for read operation RWLB, one of two read buffer transistors RD1 and RD2 may be turned on, and data stored at a bit-cell may be read by discharging a voltage of the bit line for read operation RBL. At this time, as illustrated in FIG. 7, as soon as a voltage of the word line for read operation RWLB decreases to the ground voltage (i.e., 0 V), a voltage of the local line LBL may increase to an operating voltage (i.e., $V_{DD}$=0.45 V). Accordingly, a voltage of the bit line for read operation RBL may be rapidly discharged. As such, because the read buffer transistor RD2 is turned on by applying the supply voltage to a gate terminal of the read buffer transistor RD2 by the drive transistor unit DT, data stored at a bit-cell may be rapidly and stably read.

Because a supply voltage is applied to a gate terminal of any read buffer transistor in a memory device according to an embodiment of the inventive concept, a boosted voltage, which is higher than the supply voltage, to be applied to the word line WL1 may not be used. Accordingly, read speed may be improved. Even though a suppression voltage lower than the supply voltage (i.e., $V_{DD}$) is applied to the word line WL1, read speed may be improved. Moreover, read stability may be obtained by the suppression voltage as well as improvement of the read speed.

That is, because the read speed is improved by the drive transistor unit DT and the read stability is improved by applying the suppression voltage to a word line, the read speed and read stability may be simultaneously obtained in 22-nm technology. Moreover, because a capacitance of a local line is small, obtainment of read stability may be possible. Because read buffer transistors are composed of the same type of transistors, a current may increase during a read operation, and thus read speed may be improved.

Figure 8:
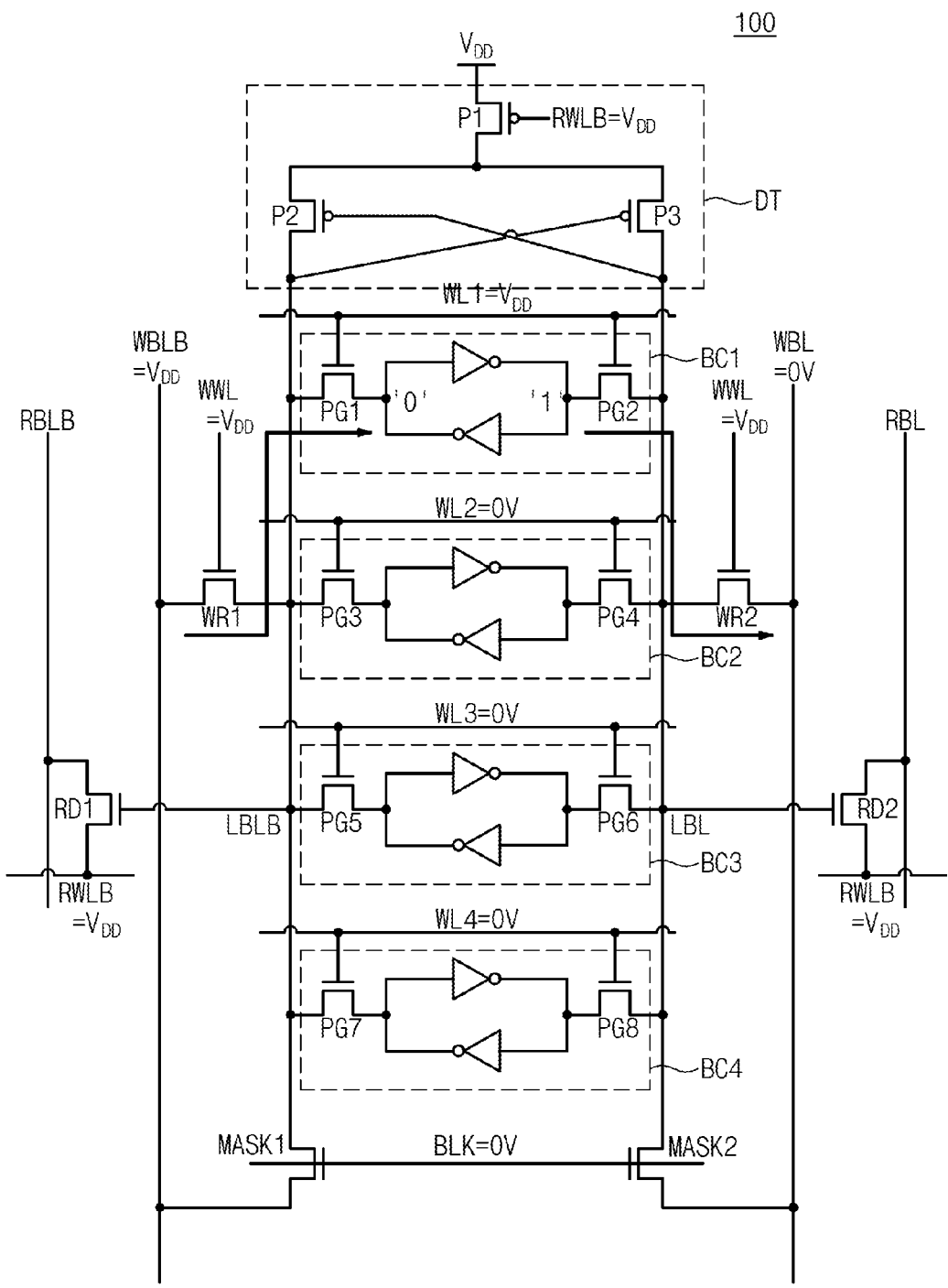
FIG. 8 is a circuit diagram illustrating a write operation of a memory device according to an embodiment of the inventive concept.

FIG. 8 is a circuit diagram illustrating a write operation of a memory device 100 according to an embodiment of the inventive concept. Referring to FIGS. 4 and 8, because a supply voltage (i.e., $V_{DD}$) is applied to the word line WL1 of the bit-cell BC1, in which a write operation is performed, and the word line for write operation WWL, the pass gate transistors PG1 and PG2 and the write operation transistors WR1 and WR2 may be turned on, and data storage nodes may be connected to the bit lines for write operation WBLB and WBL, respectively. A voltage may be applied to the bit lines for write operation WBLB and WBL based on data which a user wants to write.

The supply voltage (i.e., $V_{DD}$) is applied to the bit lines for read operation RBLB and RBL during a write operation. A ground voltage (i.e., 0 V) may be applied to gate terminals of the block mask transistors MASK1 and MASK2 during a write operation such that data storage nodes are prevented from being connected to the bit lines for write operation WBLB and WBL through the pass gate transistors PG1 and PG2 and the local lines LBLB and LBL at a row half-selected bit-cell. Accordingly, the local lines LBLB and LBL may be floated, and data of the bit lines for write operation WBLB and WBL may be stored at the bit-cell BC1 selected as a bit-cell of which the write operation is performed. The supply voltage may be applied to the word line for read operation RWLB, and thus the third drive transistor P1 may be turned off.

Because the memory device 100 according to an embodiment of the inventive concept may have a characteristic of a differential write operation, write ability may be improved. Moreover, because the supply voltage (i.e., $V_{DD}$) such as a voltage applied to the bit line for read operation RBL is applied to source terminals of the read buffer transistor RD1 and RD2, a current of the bit lines for read operation RBL and RBLB may not be leaked unnecessarily, and unnecessary power consumption may be prevented.

Figure 9:
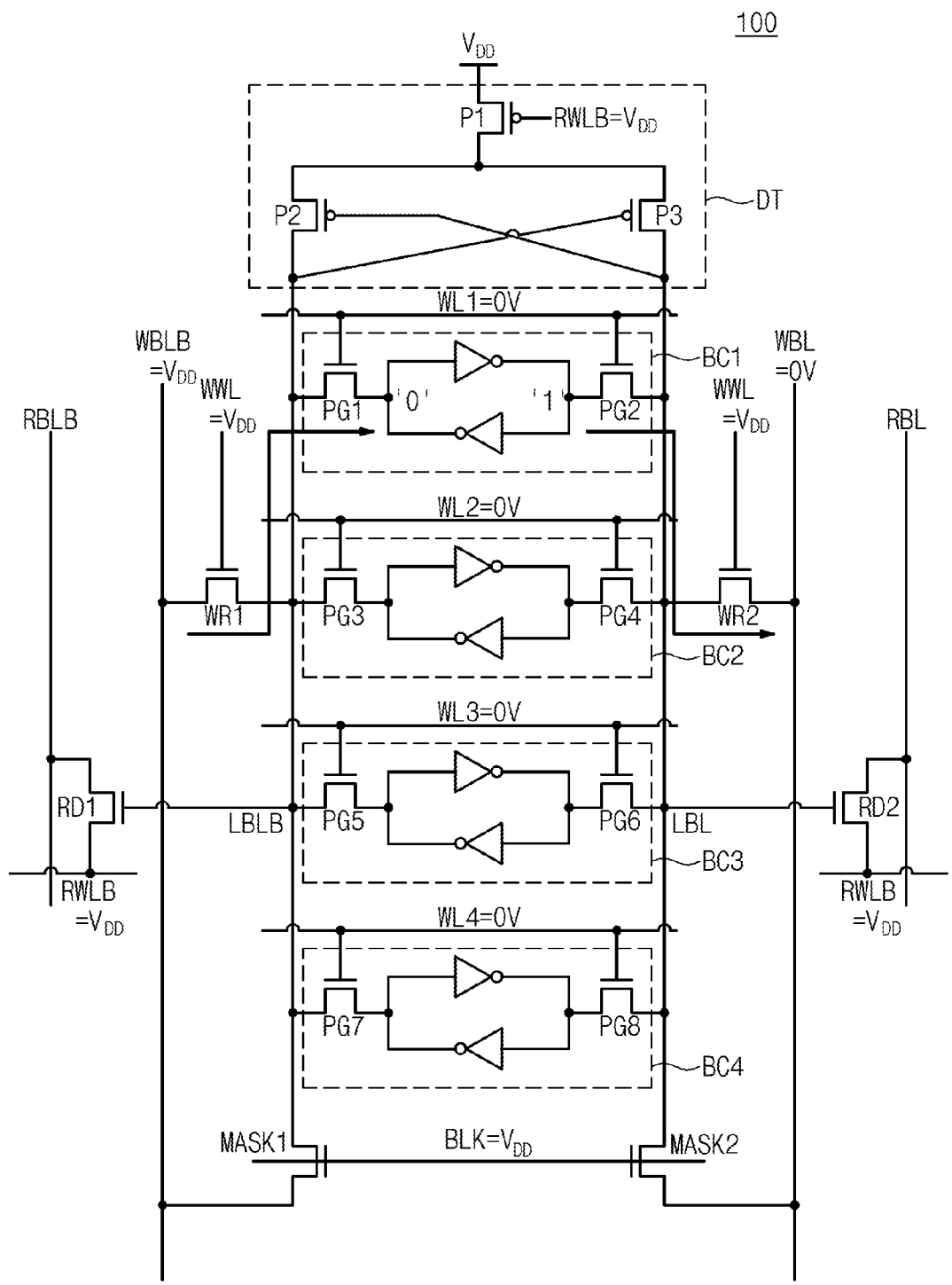
FIG. 9 is a circuit diagram illustrating a column half-selected bit-cell during a write operation of a memory device according to an embodiment of the inventive concept.

FIG. 9 is a circuit diagram illustrating a column half-selected bit-cell during a write operation of a memory device 100 according to an embodiment of the inventive concept. Referring to FIG. 9, because all word lines are fixed to 0 V in a column half-selected bit-cell, all pass gate transistors may be turned off. Accordingly, a data storage node may not be affected. Moreover, source terminals of the block mask transistors MASK1 and MASK2 may be connected to the bit lines for write operation WBLB and WBL, not grounded, thereby preventing concurrence of a DC current path passing through the write operation transistor WR1 and the block mask transistor MASK1.

Figure 10:
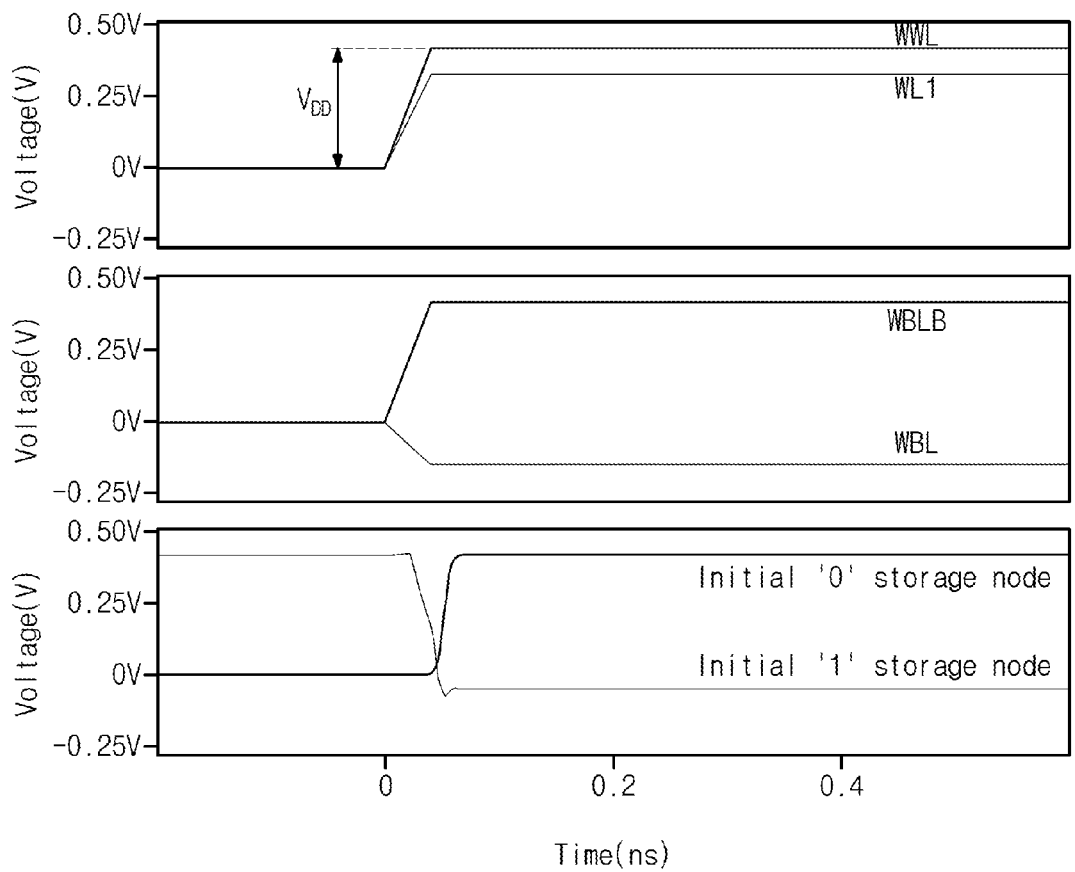
FIG. 10 is graphs illustrating a change of a voltage applied to a word line, a word line for write operation, bit lines for write operation, and data storage nodes during a write operation of a memory device according to an embodiment of the inventive concept.

FIG. 10 is graphs illustrating voltage changes of a word line WL1, a word line for write operation WWL, bit lines for write operation WBLB and WBL, and data storage nodes during a write operation of a memory device 100 according to an embodiment of the inventive concept. Referring to FIGS. 8 and 10, during a write operation, a write operation may be performed in a bit line as a supply voltage (i.e., $V_{DD}$) is applied to the word line for write operation WWL and write data is applied to the bit lines for write operation WBLB and WBL. A voltage (i.e., a suppression voltage) lower than a supply voltage (i.e., $V_{DD}$) may be used for the word line WL1 to improve stability of a row half-selected bit-cell.

Moreover, a negative voltage lower than a ground voltage (i.e., 0 V) may be used on the bit line for write operation WBL to improve write ability. In an embodiment of the inventive concept, the supply voltage may be applied to a gate terminal of the third drive transistor P1 and source terminals of the read buffer transistors RD1 and RD2 through the word line for read operation RWLB during a write operation, and thus a read operation current which is unnecessary in a row half-selected bit-cell may be prevented from being leaked.

A memory device according to an embodiment of the inventive concept may use a bit-interleaving without a write-back operation and may make it possible to reduce unnecessary dynamic power consumption at a row half-selected bit-cell. Moreover, according to an embodiment of the inventive concept, a trade-off between read speed and read stability may be removed using the drive transistor unit DT, and a low-voltage operation may be possible.

Moreover, because transistors such as a read buffer transistor are shared by a plurality of bit-cells (e.g., four bit-cells), a memory device according to an embodiment of the inventive concept may have a smaller area. That is, the number of transistors of a memory device according to an embodiment of the inventive concept by a bit-cell may be 8.25. Compared with a conventional SRAM memory device, the number of transistors by a bit-cell may be reduced by 17.5%, and an area by a bit-cell may be reduced by 25% or more. Moreover, because relatively a few transistor drain capacitances are connected to a bit line for read operation, read speed may be improved.

Furthermore, a memory device according to an embodiment of the inventive concept may make it possible to improve a ratio of current-on to current-off during a read operation due to a characteristic of bit lines for read operation RBLB and RBL independent of data and may perform a differential read operation. Accordingly, even though a voltage difference between the two bit lines for read operation RBLB and RBL is small (e.g., generally about 120 mV), sensing may be normally performed, and read speed may be improved.

A memory device according to an embodiment of the inventive concept may have a superior read stability and read speed.

Moreover, the memory device may use a bit-interleaving without a write-back operation.

The memory device may have a small area and a superior operating characteristic at a supply voltage of a low-voltage.

The memory device may make it possible to reduce unnecessary dynamic power consumption at a column or row half-selected bit-cell.

The effect of the present invention is not limited to the above-mentioned effects. Other effects which are not mentioned will be clearly understood from the following description and accompanying drawings to those skilled in the art.

The above embodiment is provided in order to give an understanding of the present invention, the scope and spirit of the inventive concept is not be limited thereto, and various modifications possible embodiments therefrom are also understood within the scope of this invention. The technical protection scope of the present invention will be defined by the technical spirit of the appended claims, the scope and spirit of the present invention is not limited to the wording of the claims, and it is to be understood that the technical value substantially affects the equivalent scope of the invention.

What is claimed is:

1. A memory device, comprising:
   a bit-cell including a cross-coupled inverter and a pass gate transistor connected to data storage node of the cross-coupled inverter;
   a read buffer transistor having a drain terminal connected to a bit line for a read operation and a gate terminal connected to the pass gate transistor;
   a write operation transistor connected between the pass gate transistor and a bit line for a write operation; and
   a drive transistor unit connected to a local line between the pass gate transistor and the write operation transistor, the drive transistor unit providing a voltage to the gate terminal of the read buffer transistor based on a data value stored at the bit-cell.

2. The memory device of claim 1, wherein the drive transistor unit comprises:
   a first drive transistor having a drain terminal connected to a first local line between a first pass gate transistor and a first write operation transistor, and a gate terminal connected to a second local line between a second pass gate transistor and a second write operation transistor, the first pass gate transistor being placed near a first data storage node of two data storage nodes, the second pass gate transistor being placed near a second data storage node of the two data storage nodes;
   a second drive transistor having a gate terminal connected to the first local line and a drain terminal connected to the second local line; and
   a supply voltage application unit configured to apply a driving voltage corresponding to a supply voltage to source terminals of the first drive transistor and the second drive transistor during the read operation.

3. The memory device of claim 2, wherein the drive transistor unit drives the voltage of the gate terminal of the read buffer transistor by applying a voltage corresponding to the driving voltage to a local line, corresponding to a data storage node storing a logic 1, during the read operation.

4. The memory device of claim 2, wherein the supply voltage application unit comprises:
   a third drive transistor having a drain terminal connected to source terminals of the first drive transistor and the second drive transistor and a source terminal to which the supply voltage is applied.

5. The memory device of claim 4, wherein voltage of a word line for the read operation is applied to a gate terminal of the third drive transistor and a source terminal of the read buffer transistor.

6. The memory device of claim 5, further comprising:
a block mask transistor connected between the local line and the bit line for the write operation, the block mask transistor connecting the bit line for the write operation with the local line during a hold operation.

7. The memory device of claim 6, wherein during the read operation, after voltage of a gate terminal of the block mask transistor is reduced, a voltage of a word line of the bit cell where the read operation is performed increases, and the voltage of the word line for the read operation decreases.

8. The memory device of claim 1, wherein during the read operation, a suppression voltage lower than a supply voltage is applied to a word line corresponding to the bit-cell in which the read operation is performed.

9. A memory device, comprising:
a plurality of bit-cells each including a cross-coupled inverter, a first pass gate transistor connected to a first data storage node of the cross-coupled inverter, and a second pass gate transistor connected to a second data storage node of the cross-coupled inverter, wherein first pass gate transistors of the bit-cells belonging to a predetermined group are connected to a first local line, and second pass gate transistors of the bit-cells are connected to a second local line;
a first write operation transistor connected between the first local line and a first bit line for a write operation;
a second write operation transistor connected between the second local line and a second bit line for the write operation;
a first read buffer transistor having a drain terminal connected to a first bit line for a read operation and a gate terminal connected to the first local line;
a second read buffer transistor having a drain terminal connected to a second bit line for the read operation and a gate terminal connected to the second local line; and
a drive transistor unit including a first drive transistor having a drain terminal connected to the first local line and a gate terminal connected to the second local line and a second drive transistor having a drain terminal connected to the second local line and a gate terminal connected to the first local line.

10. The memory device of claim 9, wherein the drive transistor unit further comprises:
a supply voltage application unit applying a driving voltage corresponding to a supply voltage to source terminals of the first drive transistor and the second drive transistor during the read operation.

11. The memory device of claim 10, wherein the drive transistor unit applies a voltage corresponding to the driving voltage to a local line, corresponding to a data storage node storing a logic 1, during the read operation to drive a voltage of the gate terminal of one of the first read buffer transistor and the second read buffer transistor.

12. The memory device of claim 10, wherein the supply voltage application unit comprises:
a third drive transistor having a drain terminal connected to source terminals of the first drive transistor and the second drive transistor and a source terminal to which the supply voltage is applied.

13. The memory device of claim 9, further comprising:
a first block mask transistor connected between the first local line and the first bit line for the write operation, the first block mask transistor connecting the first bit line for the write operation with the first local line during a hold operation; and
a second block mask transistor connected between the second local line and the second bit line for the write operation, the second block mask transistor connecting the second bit line for the write operation with the second local line during the hold operation.

14. The memory device of claim 9, wherein during the read operation, a suppression voltage lower than a supply voltage is applied to a word line corresponding to a bit-cell in which the read operation is performed.

15. The memory device of claim 9, wherein a negative voltage lower than a ground voltage is applied to one of the first bit line for the write operation and the second bit line for the write operation during the write operation, and
wherein a suppression voltage lower than a supply voltage is applied to a word line corresponding to a bit-cell in which the write operation is performed.

16. A memory device, comprising:
a plurality of bit-cells each including a cross-coupled inverter, a first pass gate transistor connected to a first data storage node of the cross-coupled inverter, and a second pass gate transistor connected to a second data storage node of the cross-coupled inverter, wherein first pass gate transistors of the bit-cells belonging to a predetermined group are connected to a first local line, and second pass gate transistors of the bit-cells are connected to a second local line;
a drive transistor unit connected between the first local line and the second local line, the drive transistor unit applying a voltage corresponding to the driving voltage to a local line, corresponding to a data storage node storing a logic 1, during a read operation, the drive transistor unit including,
a first drive transistor having a drain terminal connected to the first local line and a gate terminal connected to the second local line,
a second drive transistor having a drain terminal connected to the second local line and a gate terminal connected to the first local line, and
a third drive transistor connected between source terminals of the first drive transistor and the second drive transistor, the third drive transistor applying a voltage corresponding to the driving voltage to a local line, corresponding to a data storage node storing a logic 1, during the read operation.

17. The memory device of claim 16, further comprising:
a first write operation transistor connected between the first local line and a first bit line for a write operation;
a second write operation transistor connected between the second local line and a second bit line for the write operation;
a first read buffer transistor having a drain terminal connected to a first bit line for the read operation and a gate terminal connected to the first local line;
a second read buffer transistor having a drain terminal connected to a second bit line for the read operation and a gate terminal connected to the second local line;
a first block mask transistor connected between the first local line and the first bit line for the write operation, the first block mask transistor connecting the first bit line for the write operation with the first local line during a hold operation; and
a second block mask transistor connected between the second local line and the second bit line for the write operation, the second block mask transistor connecting the second bit line for the write operation with the second local line during the hold operation.

* * * * *